(12) United States Patent
Herrera-Abella et al.

(10) Patent No.: US 6,837,125 B1
(45) Date of Patent: Jan. 4, 2005

(54) AUTOMATIC TEST MANIPULATOR WITH SUPPORT INTERNAL TO TEST HEAD

(75) Inventors: Carlos A. Herrera-Abella, Waltham, MA (US); Robert Keus, Atkinson, NH (US); Janusz Kunda, Canton, MA (US)

(73) Assignee: Teradyne, Inc., Boston, MA (US)

( * ) Notice: Subject to any disclaimer, the term of this patent is extended or adjusted under 35 U.S.C. 154(b) by 63 days.

(21) Appl. No.: 09/615,292

(22) Filed: Jul. 13, 2000

Related U.S. Application Data

(60) Provisional application No. 60/143,733, filed on Jul. 14, 1999, and provisional application No. 60/152,415, filed on Sep. 3, 1999.

(51) Int. Cl.$^7$ .............................................. G05G 11/00
(52) U.S. Cl. .................. 74/490.01; 324/758; 73/866.5; 74/490.07; 414/668
(58) Field of Search ..................... 74/490.01, 490.05, 74/490.07; 248/124.1, 178.1, 276.1, 279.1, 281.11; 324/758; 414/668, 669, 670; 73/865.8, 865.9, 866.5; 901/45

(56) References Cited

U.S. PATENT DOCUMENTS

| 5,642,056 A | * | 6/1997 | Nakajima et al. | ............ 324/758 |
| 5,821,440 A | * | 10/1998 | Khater et al. | ............... 73/866.5 |
| 5,931,048 A | * | 8/1999 | Slocum et al. | ........... 74/490.07 |

FOREIGN PATENT DOCUMENTS

| WO | WO 92/26446 A | 8/1996 | ...................... 1/67 |
| WO | WO 98/49569 A | 11/1998 | ...................... 31/2 |

* cited by examiner

Primary Examiner—William C. Joyce
(74) Attorney, Agent, or Firm—Teradyne Legal Department

(57) ABSTRACT

A manipulator for accurately positioning a test head in automatic test systems supports the test head internally and reduces the overall size of the manipulator. The manipulator includes an elongated blade that extends into a central region of the test head. A spherical bearing is disposed within an opening of the elongated blade, and has an outlet race attached to the elongated blade. A shaft passes through the inner race of the spherical bearing and attaches to the body of the test head via a transition insert. The test head can thus be supported internally and made to rotate in compliance on the spherical bearing, about all axes of rotation.

23 Claims, 4 Drawing Sheets

AUTOMATIC TEST MANIPULATOR WITH SUPPORT INTERNAL TO TEST HEAD

This application claims priority from U.S. Provisional Patent Application Ser. No. 60/143,733, filed Jul. 14, 1999 and U.S. Provisional Patent Application Ser. No. 60/152,415 filed on Sep. 3, 1999.

This invention relates generally to precisely positioning heavy objects, and more particularly to a device for positioning the test head portion of automatic test equipment.

BACKGROUND OF THE INVENTION

Manufacturers of semiconductor chips and assemblies use automatic test equipment ("ATE") to verify device functionality and performance. These manufacturers preferably test semiconductor chips as early as possible in the manufacturing process to avoid the costs of processing defective devices. A device called a "prober" holds unpackaged chips for testing by the ATE. A device called a "handler" holds packaged chips.

ATE systems typically include a "test head." The test head houses potions of the ATE that are preferably located as closely as possible to the device under test, and connects to a main body of the ATE via one or more cables. To test a device, the test head is "docked," or secured, with the prober or handler, and the ATE tests the chip.

Constraints affecting semiconductor testing make it impractical to move the chips to the test head. In most modern manufacturing facilities, the prober or handler that holds the chips remains stationary, and the test head is moved to dock with the prober or handler.

The ATE moves the test head to the prober or handler using a device called a "manipulator." Manipulators must satisfy a complicated and difficult set of requirements. First, the manipulator must be able to handle heavy test heads. Test heads for high performance ATE can weigh hundreds, or even thousands, of pounds.

Also, the manipulator must be able to change the orientation of the test head to enable the test head to dock with a wide range of prober/handlers. Some prober/handlers require that the test head be positioned vertically, and others require that it be positioned horizontally. Still others require that the test head be oriented at an angle between horizontal and vertical.

The manipulator must provide "compliance" about various axes of rotation. "Compliance" is the range of rotation over which a test head can be adjusted, to dock the test head with the prober/handler once the manipulator places the test head approximately in position. Achieving compliance is particularly difficult if a test head is heavy, as the manipulator must be well balanced and have low enough friction to allow fine adjustments to be made.

The manipulator also must fit in the physical space available on the test floor. ATE systems generally integrate with existing test facilities, many of which have extremely limited available floor space. As test heads grow and become increasingly heavy, manipulators tend to grow proportionally. Frequently, little room is available on the test floor to accommodate the growth of the manipulator.

Prior manipulator designs have attempted to address this difficult set of requirements by providing parallel fork arms for holding a test head from its sides. According to these designs, the test head includes an adapter on each side for receiving one of the manipulator's fork arms. The fork arms join behind the test head and form a single shaft. The manipulator can lift the shaft to adjust the height of the test head, and rotate the shaft to adjust the angle of the test head. Each fork arm includes a rotational bearing coupled to the respective adapter on each side of the test head. The rotational bearings enable the test head to rotate in an up-down, or "tumble," direction (described below).

For heavy test heads, the fork arms of the manipulator become exceedingly thick. The heavier the test head, the thicker the fork arms must be. In addition, the fork arms generally include mechanical parts that provide compliance about various axes of rotation. Larger mechanical parts are generally required for larger test heads, and the fork arms become thicker still. Thick fork arms interfere with neighboring equipment, and conflict with the requirement that the manipulator fit within the available space on the test floor.

Moreover, the fork arm manipulator uses distinct sets of mechanical parts to achieve compliance about different axes of rotation. For example, rotation about the "theta" and "tumble" axes (described below) is provided by parts within each of the two fork arms. Rotation about the "twist" axis (described below) is provided by parts coupled to the shaft behind the test head. Requiring different parts at different locations within the manipulator to achieve compliance adds complexity to the manipulator and, again, takes up additional space.

With the foregoing background in mind, its an object of the invention to provide a manipulator that takes up relatively little space even when used with heavy test heads.

Another object of the invention is to provide compliance for a test head about different axes of rotation in a relatively simple manner.

To achieve the foregoing objects and other objectives and advantages, a manipulator includes an elongated blade that extends along a central axis from a region outside of a test head into an internal region of the test head. The manipulator includes an interface coupling disposed in the internal region of the test head. The interface coupling has a first portion coupled to the elongated blade and a second portion coupled to the test head. The first and second portions of the interface coupling are free to rotate with respect to each other in compliance about at least one axis of rotation.

In accordance with another embodiment of the invention, a manipulator includes a stiffener fixedly attached to the test head and having top, bottom, and back portions. An elongated blade extends into an internal region of the test head between the top and bottom portions of the stiffener and in front of the back portion of the stiffener. The manipulator includes an interface coupling that has a first portion coupled to the elongated blade and a second portion coupled to the stiffener. The first and second portions of the interface coupling are free to rotate with respect to each other in compliance about at least one axis of rotation.

In accordance with another embodiment of the invention, a method of assembling a test head for use with a manipulator includes providing a stiffener having top, bottom, and back portions. The method includes inserting an elongated blade into an internal region between the top and bottom portions of the stiffener and in front of the back portion of the stiffener, and attaching the elongated blade to the stiffener. The method also includes fastening respective first and second portions of the test head to left and right mounting surfaces of the stiffener.

Additional objects, advantages and novel features of the invention will become apparent from a consideration of the ensuing description and drawings.

BRIEF DESCRIPTION OF THE DRAWINGS

The invention will be better understood by reference to the following more detailed description and accompanying drawings, in which.

DESCRIPTION OF THE PREFERRED EMBODIMENT

Figure 1:
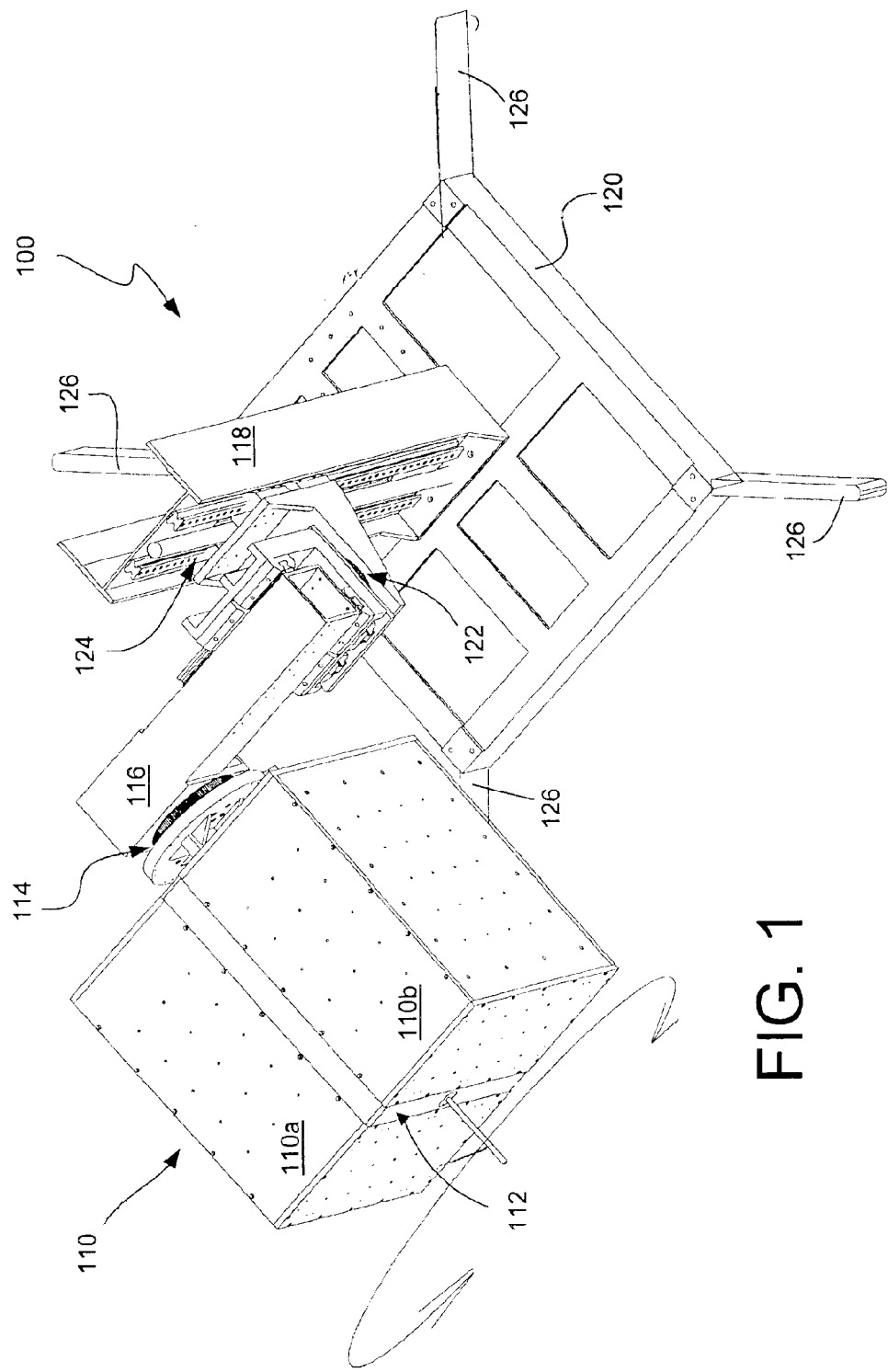
FIG. 1 is a perspective view of an assembled manipulator and test head in ment of the invention.

FIG. 1 illustrates a manipulator and test head according to the invention. A manipulator 100 supports a test head 110 from a region internal to the test head 110, and precludes the need for external arms. The manipulator 100 rotates the test head between horizontal and vertical orientations upon a twist bearing 114, and swings the test head at the end of a horizontal member 116 upon a swing bearing 122. The manipulator 100 raises and lowers the test head on a pair of linear bearings 124 supplied on an elevator member 118. The manipulator 100 further includes a base 120, which preferably includes outriggers 126.

The test head 110 consists of at least two sections: a right section 110a and a left section 110b. The right and left sections of the test head 110 respectively attach to right and left surfaces of a stiffener 112. The stiffener 112 helps to support the weight of the test head 110, which in the present implementation may exceed 2,500 lbs. The stiffener 112 also includes an interface coupling that connects the manipulator to the test head.

Test heads typically include electrical backplanes filled with circuit boards. A space is generally provided between adjacent backplanes to promote air flow and access to circuit boards. We have recognized that this space can also be used to provide the stiffener 112 for supporting the test head internally. As this space is already provided, the stiffener 112 takes up little additional space within the test head 110.

The two sections 110a and 110b of the test head preferably have similar size, shape, weight, and weight distribution, to keep the rotational moment of the test head small about the twist bearing 114. Alternatively, the two sections of the test head are dissimilar, but are balanced with respect to the stiffener 112 to reduce the rotational moment.

The manipulator 100 preferably includes motors (not shown) on the twist bearing 114 and linear bearings 124. A motor may also be included for the swing bearing 122. The motors move and orient the test head to an approximate position and angle for testing. The test head is then docked with a prober/handler by finely adjusting the position and orientation of the test head within the compliance range of the manipulator. As shown in FIG. 1, the manipulator is capable of moving and rotating the test head over a wide range, for docking with a variety of different prober/handlers.

The details of the base 120, elevator member 118, horizontal member 116, and bearings 114, 122, 124 of the manipulator 100 are provided for illustration, to show how an internally supported test head can be moved and oriented. These details can be varied significantly within the scope of the invention.

Figure 2:
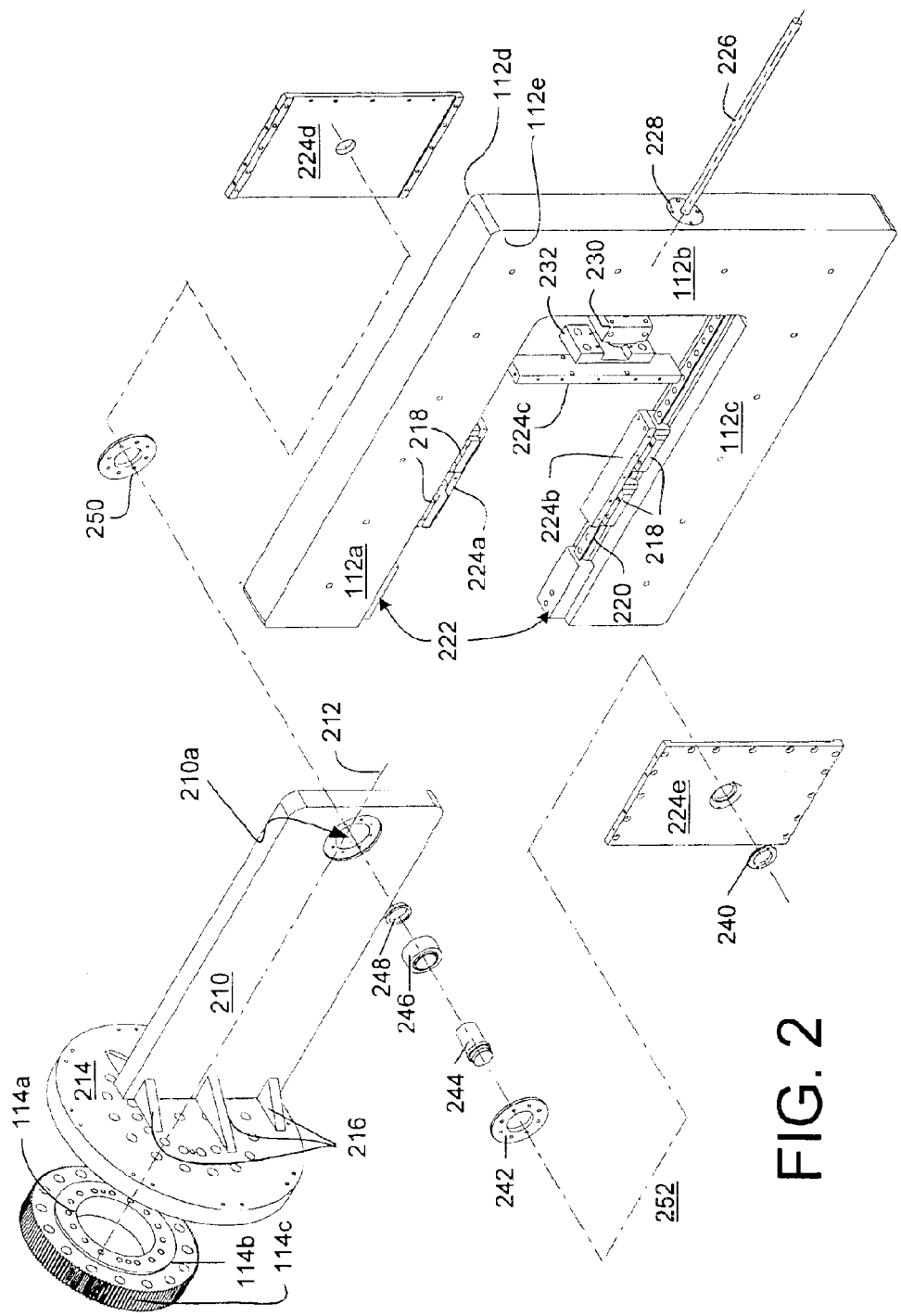
FIG. 2 is an exploded, perspective view of a manipulator of FIG. 1, which illustrates the components at the interface between the manipulator and the test head.

FIG. 2 illustrates the mechanical interface between the manipulator 100 and the test head 110 according to the invention. The right and left sections 110a and 110b of the test head 110 have been omitted for clarity. As shown in FIG. 2, the stiffener 112 includes three portions that come together to form a C-shaped structure: a top portion 112a, a back portion 112b, and a bottom portion 112c. The top, bottom, and back portions can be manufactured as a single piece (as shown), or can be manufactured as separate pieces that are fastened together.

The stiffener 112 has right and left surfaces, respectively 112d and 112e, to which the right and left sections of the test head 110 attach using fasteners, such as screws, nuts and bolts, or the like. Optionally, the stiffener may include apertures (not shown) between the right and left surfaces, which convey cables between the right and left sections of the test head 110 and promote airflow. The stiffener 112 need not span the entire width and depth of the test head as shown, but rather may occupy only a central portion of the test head.

The manipulator 100 includes an elongated blade 210 that internally supports the test head 110. The elongated blade 210 extends from a region outside of the test head, into an internal region of the test head, where it is coupled to the test head. Outside of the test head, the elongated blade 210 is attached to a twist adapter plate 214. The twist adapter plate 214 is attached to an inner race 114a of the twist bearing 114, and an outer race 114b of the twist bearing 114 is attached to the horizontal member 116 (see FIG. 1). The elongated blade 210 can thus be made to rotate with respect to the horizontal member 116 on the twist bearing 114, and can be otherwise moved and rotated by the manipulator 100. Preferably, a motor (not shown) is included on the twist adapter plate 214. A rack and pinion assembly (not shown) extends from the twist adapter plate and engages a set of outside teeth 114c of the twist bearing, to effect a rotation of the elongated blade 210.

The inner and outer races of the twist bearing 114 preferably attach to the twist adapter plate 214 and horizontal member 116 using fasteners, such as bolts. Other types of fasteners can be used. Preferably, pins are provided to ensure accurate alignment. The elongated blade is preferably welded to the twist adapter plate 214, and welded gussets 216 are included on right and left sides of the elongated blade to strengthen the connection. When the elongated blade 210 is oriented vertically, the gussets 216 help to stabilize the test head 110. When the elongated blade is oriented horizontally, the gussets 216 contribute significantly to supporting the weight of the test head.

Inside the test head 110, the elongated blade 210 is coupled to the stiffener 112 using a transition insert 224. The transition insert 224 includes top and bottom plates, respectively 224a and 224b, back plate 224c, and right and left plates, respectively 224d and 224e. These plates 224a–e come together to form a five-sided enclosure (see FIG. 4). The front of the transition insert is open. To allow surfaces of the right and left sections 110a and 110b of the test head that attach to the stiffener to be flat, the transition insert is preferably no wider than the stiffener 112.

The top and bottom plates 224a and 224b of the transition insert are respectively coupled to the top and bottom portions 112a and 112c of the stiffener 112. The right and left plates 224d and 224e are each attached to the top and bottom plates 224a and 224b. The back plate 224c is attached to the top, bottom, right, and left plates. Fasteners, for example screws, are preferably used to hold the different plates of the transition insert together. The back plate 224c is also attached to the back portion 112b of the stiffener using a lead screw 226. The transition insert 224 is thus held firmly in place with respect to the test head within the stiffener 112.

The elongated blade 210 enters the transition insert and is coupled thereto using an interface coupling. The interface coupling includes a first portion attached to the elongated blade 210 and a second portion attached to the transition insert 224. The first and second portions of the interface coupling are coupled to each other and are free to rotate about at least one axis of rotation.

Preferably, the interface coupling includes a spherical bearing 246. As is known, a spherical bearing includes an inner race having a spherical shape and a hole for receiving a shaft. The spherical bearing also includes an outer race shaped like a spherical cavity. The spherical bearing is preferably lubricated between the inner and outer races to provide low friction movement. Alternatively, the inner and outer races may move on roller bearings. The inner and outer races of the spherical bearing are thus free to rotate with respect to each other about all axes of rotation. The spherical bearing is capable of handling loads both in its normal configuration, with the shaft positioned horizontally, and in its thrust position, with the shaft positioned vertically.

The spherical bearing 246 is disposed within a hole 210a of the elongated blade 210. Right and left retaining plates 250 and 242 attach to the elongated blade 210, and clamp the outer race of the spherical bearing 246 to the elongated blade 210. A shaft 244 passes through and engages the inner race of the spherical bearing. The outer diameter of the shaft 244 is smaller than the inner diameters of the retaining plates 250 and 242, to allow the shaft to rotate about various axes of rotation without interfering with the retaining plates. A spacer 248 centers the spherical bearing 246 within transition insert 224, and the shaft 244 engages holes in the right and left plates of the transition insert 224, where the shaft fixedly attaches to the plates. With this arrangement, the inner race of the spherical bearing is referenced to the test head, and the outer race is referenced to the manipulator.

Compliance of the manipulator about all axes of rotation is thereby accomplished using a single component, the spherical bearing 246. The range of compliance is limited by the relative dimensions of the elongated blade 210 and the transition insert 224. Bumpers 222 are attached to the stiffener above and below the elongated blade to safely limit the range of compliance about one axis. Other bumpers may be provided within the transition insert to safely limit the range of rotation about other axes. The bumpers preferably consist of rubber or another strong, compressible material.

Figure 3:
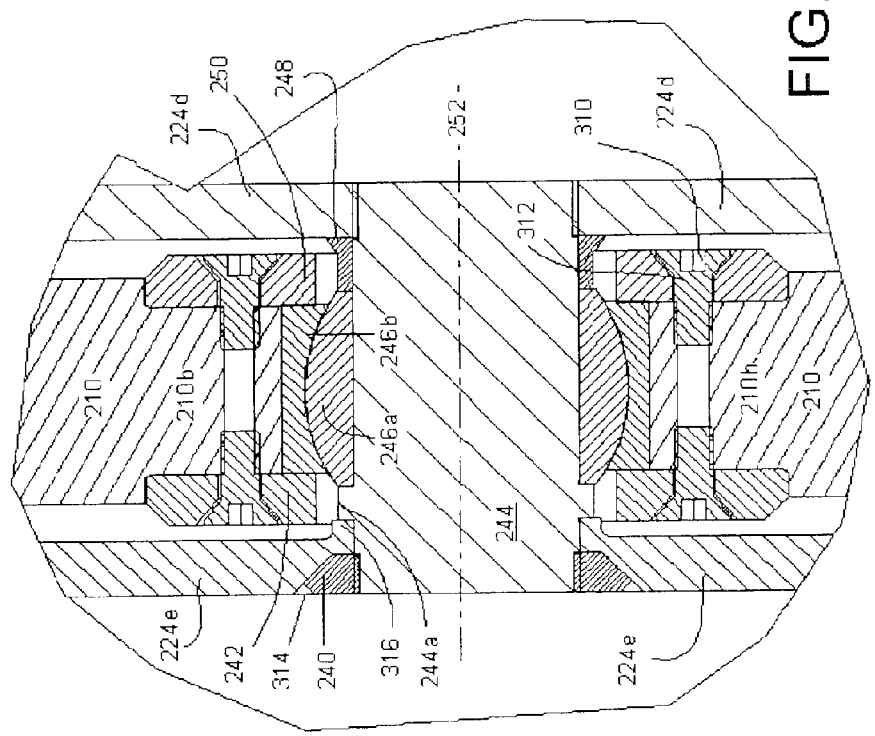
FIG. 3 is a cross sectional view of the interface between the manipulator and the test head, taken along section line S—S of FIG. 4.
Figure 4:
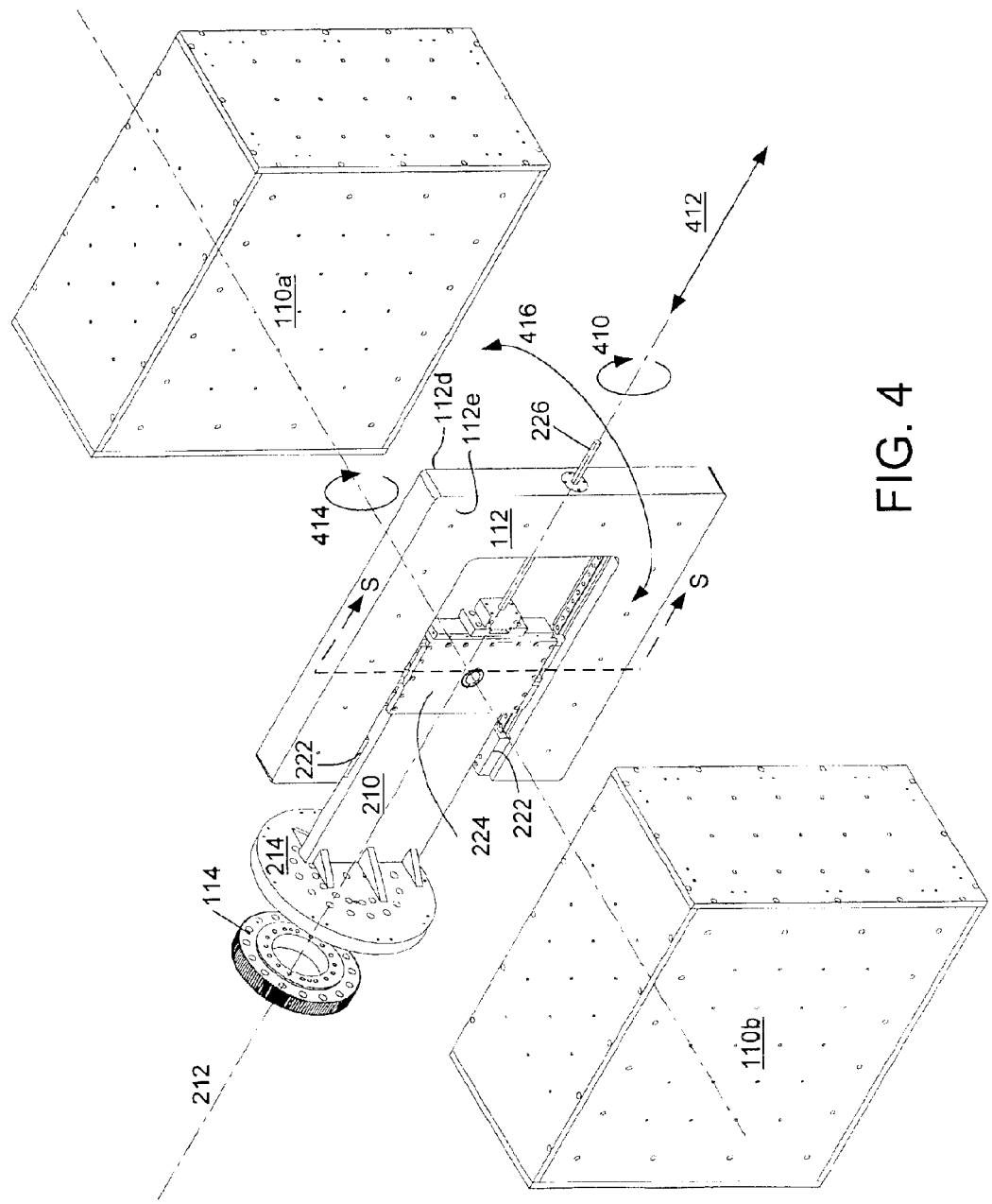
FIG. 4 is a partially assembled, perspective view of the manipulator and test head according to the invention, which shows the attachment of the test head to the manipulator and compliance of the manipulator about different axes of rotation.

FIG. 3 illustrates the transition insert 224 in cross-section, with the section taken along line S—S of FIG. 4, through the center of the spherical bearing 246. As shown in FIG. 3, the shaft 244 passes through the inner race 246a of the spherical bearing 246 and attaches to the left and right plates 224e and 224d of the transition insert. The shaft 244 is threaded at both ends. The threads at the left end of the shaft 244 engage a nut 240, which is disposed within a relief 314 within the left plate 224e. The threads at the right end of the shaft 244 engage a threaded hole in the right plate 224a of the transition insert. The trailing face of the nut 240 preferably lies flush with the left edge of the left plate. The nut 240 is preferably a low profile nut, such as a "bear hug" nut.

The left plate 224e preferably includes a boss 316. The boss 316 provides additional strength to the left plate in the area opposing the relief 314. The shaft 244 preferably includes a shoulder 244a between the boss 316 and the inner race 246a of the spherical bearing, which maintains a proper spacing therebetween.

The spacer 248 is positioned between the inner race 246a of the spherical bearing and the right plate 224d of the transition insert. The spacer maintains proper spacing between the inner race and the right plate, and centers the inner race 246a within the transition insert 224. The spacer 248 preferably has a widened portion adjacent to the right plate 224d, to provide additional strength.

The outer race 246b of the spherical bearing is clamped to the elongated blade 210 using retaining plates 242 and 250 and screws 310 that engage tapped holes 312. The elongated blade 210 preferably has a relieved region 210b at which the retaining plates attach. The width of the relieved region 210b of the elongated blade is slightly less than the width of the outer race 246b of the spherical bearing. Tightening the screws 410 into the elongated blade 210 thus exerts a compressive force on the outer race 246b, which firmly holds the outer race to the elongated blade.

The screws 310 can be replaced with other fasteners. For example, a screw could extend through a hole 312 in one retaining plate, through the elongated blade 210, and through another hole 312 in the other retaining plate, where it engages a nut, such as a bear hug nut.

Returning to FIG. 2, the transition insert 224 preferably does not fixedly attach to the stiffener 112. Rather, it attaches to the stiffener via a linear bearing assembly. The purpose of the linear bearing assembly is to allow the test head 110 to be moved forward and back, to balance the test head on the spherical bearing. In one embodiment, each of the top and bottom plates 224a and 224b of the transition insert is fastened to a pair of trucks 218. A rail 220 is fastened to each inner face of the top of the bottom portions of the stiffener 112. The trucks engage the rails, and enable the transition insert to be moved forward and back. The trucks and rails constrain movement of the transition insert in all directions except the forward-and-back direction.

In another embodiment (not shown), only one of the top and bottom plates of the transition insert is provided with trucks, and the other plate is provided with a guide (not shown). Unlike the truck coupling which constrains all movement along a rail except in the forward-and-back direction, the guide coupling constrains only side-to-side movement on the rail. The guide is thus free to move forward-and-back, as well as up-and-down. The weight of the test head 110 may cause the top and bottom portions of the stiffener 112 to spread apart or compress together. The guide allows the dimensions of the stiffener to vary under the weight of the test head, while keeping the transition insert centered over the rail. Use of one truck/rail bearing and one guide/rail bearing thus relieves the need for accurate dimensioning of the stiffener.

The transition insert 224 is moved along the linear bearing assembly using a linear adjustment mechanism. The linear adjustment mechanism includes a lead screw 226, a threaded insert 228, a lead screw terminal 230, and an adapter piece 232. The threaded insert 228 is attached to the rear of the stiffener 112, and the lead screw 226 is threaded through the threaded insert. The lead screw terminal 230, the adapter piece 232, and the rear plate 224c of the transition insert are all attached together using fasteners, for example, screws. The lead screw 226 is captured by the lead screw terminal 230, and allowed to rotate freely without advancing or withdrawing, i.e., the lead screw terminal 230 is not threaded. As the lead screw 226 is rotated, it is advanced and withdrawn within the threaded insert 228. The transition insert is moved correspondingly along the rails 220. In the preferred embodiment, the lead screw 226 and the lead screw terminal 230 are purchased as a set, which attaches to the transition insert using the adapter piece 232. Alternatively, the lead screw terminal 230 could be adapted to directly attach to the transition insert. In this case, the adapter piece 232 could be omitted.

Alternatively, the threaded insert 228 is attached to the inside of the rear portion 112b of the stiffener, and a shorter lead screw is provided that does not extend out of the back of the stiffener. Movement of the transition insert is accomplished by inserting a tool into a hole co-linear with the lead screw at the back of the stiffener, and engaging the lead screw. As the lead screw is turned, the transition insert is advanced and withdrawn as before.

FIG. 4 illustrates the manipulator and test head in a partial state of assembly. The transition insert 224 and linear adjustment mechanism are shown fully assembled within the stiffener 112.

An arrow 410 illustrates rotation of the test head in compliance about an axis commonly known as "twist." The operator can move the test head about the twist axis by turning the test head in the direction (or in the opposite direction) of the arrow 410. The test head rotates on the spherical bearing 246. The stiffener 112 and transition insert 224 all maintain a fixed position and angle with respect to the test head 110, and all rotate together with respect to the elongated blade 210. The range of compliance in the twist direction is determined by the relative dimensions of the transition insert 224 and elongated blade 210. The wider the transition insert 224 is with respect to the width of the elongated blade 210, the greater the range of compliance about the twist axis.

The arrow 414 illustrates rotation of the test head about an axis commonly known as "tumble." The test head can be turned about the tumble axis by rotating the test head on the spherical bearing 246 in the direction (or in the opposite direction) of the arrow 414. The range of compliance about the tumble axis is determined by the clearance between the top and bottom portions of the stiffener 112 and the elongated blade 210. Bumpers 222 safely limit the range of compliance about the tumble axis.

The arrow 416 illustrates rotation of the test head about an axis known as "theta." The test head is turned about the theta axis by rotating the test head on the spherical bearing 246 in the direction (or in the opposite direction) of the arrow 416. The wider the transition insert 224 is with respect to the width of the elongated blade 210, the greater the range of compliance about the theta axis.

The spherical bearing thus provides compliance about all axes of rotation, to allow the test head to dock with a prober or handler. The manipulator according to the invention provides compliance about all axes of rotation using a single component, the spherical bearing 246, at a single location within the transition insert 224.

A test head can be assembled for use with the manipulator 100 according to the following method. Beginning with the stiffener 112 having top, bottom, and back portions, respectively 112a, 112b, and 112c, and having right and left mounting surfaces 112d and 112e, the elongated blade 210 is inserted into an internal region of the stiffener. The elongated blade 210 is attached to the stiffener 112 by assembling the transition insert with the spherical bearing. The trucks 218 (or trucks and guide) are brought into engagement with the rails 220, and the lead screw 226 is attached to the back plate 224c of the transition insert.

In accordance with one embodiment, the transition insert is pre-assembled on the elongated blade 210, before the elongated blade is inserted into the stiffener. Alternatively, the transition insert is assembled in situ within the stiffener 112.

After the stiffener 112, transition insert 224, elongated blade 210, and lead screw 226 are assembled together, the right and left sections 110a and 110b of the test head are attached to the stiffener 112. Attachment is preferably made using fasteners, such as screws, nuts and bolts, or the like.

Once the test head 110 is attached, cables and cooling (not shown) may be installed. The test head is then balanced upon the spherical bearing 246 by operating the lead screw 226. Turning the lead screw 226 moves the entire test head 110 forward or back along the rails 220. The test head is balanced when it does not tend to rotate about the tumble axis 314, with the test head oriented vertically as shown in FIG. 4. Balancing the test head makes it easier to rotate the test head in compliance, and thus makes it easier to dock the test head with the prober or handler.

With the test head 110 thus assembled, part of what is generally thought of as the manipulator 100 resides within the test head 110. If different test heads are to be used with a single manipulator, each test head should preferably include its own elongated blade 210, twist adapter plate 214, and transition insert 224, in addition to its own stiffener 112. Attaching a test head to the manipulator thus becomes a matter of attaching the twist adapter plate 224 to the twist bearing 114. The break between the portions that stay with the test head and those that stay with the manipulator can be varied for convenience. For example, if practical, a test head might be stored with the twist bearing 114 attached.

Having described one embodiment, numerous alternative embodiments or variations might be made. For example, the linear bearing assembly and linear adjustment mechanism can be varied or eliminated altogether. The test head can instead be balanced by applying weights within or outside the test head, rather than by moving the test head with respect to the spherical bearing. Alternatively, the test head can be inherently balanced by design.

The transition insert 224 can be replaced by any structure within the test head that engages one race of the spherical bearing. For example, the test head itself can be provided with a pair of fittings that receive the shaft 244, which is coupled to the inner race of the spherical bearing.

The stiffener 112 can be varied or eliminated. The two sections of the test head 110 can be reshaped to attach directly, and can provide a relieved region in respective facing surfaces to provide space for the elongated blade 210. Walls of the test head sections can be reinforced, or numerous, smaller stiffeners can supply the required strength.

The spherical bearing 246 can be replaced by separate circular bearings or by a universal joint. For instance, a universal joint could provide compliance along at least two axes of rotation.

Therefore, the invention should broadly construed to include these and other foreseeable variations, and should be limited only by the spirit and scope of the appended claims.

What is claimed is:

1. A manipulator for positioning and orienting a test head, comprising:

an elongated blade that extends along a central axis from a region outside the test head into an internal region of the test head; and an interface coupling disposed in the internal region of the test head, having a first portion coupled to the elongated blade and a second portion coupled to the test head, the first and second portions being free to rotate with respect to each other in compliance with forces between the first and second portions about at least one axis of rotation;

wherein interface coupling includes a bearing assembly, the first portion of the interface coupling including a first race of the bearing assembly and the second portion of the interface coupling including a second race of the bearing assembly.

2. The manipulator of claim 1, wherein the bearing assembly is a spherical bearing, and the first and second races are free to rotate with respect to each other in compliance about all axes of rotation.

3. The manipulator of claim 2, wherein the first race is an outer race of the spherical bearing and the second race is an inner race of the spherical bearing.

4. The manipulator of claim 2, further comprising a transition insert disposed in the internal region of the test head and having an opening into which the elongated blade enters, wherein the transition insert is coupled to the test head and fixedly attached to the first and second races of the spherical bearing.

5. The manipulator of claim 4, further comprising at least one linear coupling oriented in parallel with the central axis and having first and second elongated components, the first component being coupled to the test head and the second component being coupled to the transition insert, the first and second components being movably coupled to each other.

6. The manipulator of claim 5, further comprising a linear adjustment mechanism, having a first portion coupled to the test head and a second portion coupled to the transition insert, wherein the linear adjustment mechanism is adapted to move the test head along the at least one linear coupling relative to the elongated blade.

7. The manipulator of claim 1, further comprising at least one linear coupling oriented in parallel with the central axis and having first and second elongated components, the first component being coupled to the test head and the second component being coupled to the elongated blade, the first and second components being movably coupled to each other.

8. The manipulator of claim 7, wherein the first component of each at least one linear coupling includes one of a truck and a rail, and the second component of each at least one linear coupling includes the other of the truck and the rail.

9. The manipulator of claim 8, wherein the at least one linear coupling includes two linear couplings disposed on opposing sides of the elongated blade.

10. The manipulator of claim 8, wherein the at least one linear coupling comprises one linear coupling, and further comprising an elongated guide, the one linear coupling and the elongated guide being disposed on opposing sides of the elongated blade.

11. The manipulator of claim 7, wherein the interface coupling further includes a linear adjustment mechanism, having a first portion coupled to the test head and a second portion coupled to the elongated blade, the linear adjustment mechanism being adapted to move the test hand relative to the elongated blade along the at least one linear coupling.

12. The manipulator of claim 11, wherein the linear adjustment mechanism includes at least one lead screw, the lead screw engaging a threaded region of the test head and having a termination coupled to the elongated blade.

13. The manipulator of claim 1, further comprising a transition insert disposed in the internal region of the test head and having an opening into which the elongated blade enters, the transition insert being coupled to the test head and fixedly attached to the first and second portions of the interface coupling.

14. The manipulator of claim 13, wherein the interface coupling includes a spherical bearing wherein the first portion of the interface coupling includes an outer race of the spherical bearing and the second portion of the interface coupling includes an inner race of the spherical bearing.

15. The manipulator of claim 14, wherein the elongated blade has a hole in which spherical bearing is disposed, and the transition insert further comprises:

left and right plates, disposed on opposing sides of the elongated blade, each having a hole that aligns with the hole in the elongated blade; and a shaft passing through the holes in the left and right plates, though the hole in the elongated blade and engaging the inner race of the spherical bearing.

16. The manipulator of claim 15, wherein the transition insert further includes: left and right retainers fixedly attached to the elongated blade on opposing sides of the hole in the elongated blade and engaging the outer race of the spherical bearing.

17. A manipulator for positioning and orienting a test head, comprising:

a stiffener fixedly attached to the test head and having top, bottom, and back portions; elongated blade extending along a central axis from a region outside the test head into an internal region of the test head between the top and bottom portions of the stiffener and in front of the back portion of the stiffener; and an interface coupling having a first portion coupled to the elongated blade in the internal region of the test head and a second portion coupled to the stiffener, the first and second portions of the interface coupling being free to rotate with respect to each other in compliance with forces between the first and second portions of the interface coupling about at least one axis of rotation.

18. The manipulator of claim 17, further comprising a transition insert disposed in the internal region of the test head and having an opening into which the elongated blade enters, wherein the transition insert is coupled to the stiffener and fixedly attached to the first and second portions of the interface coupling.

19. The manipulator of claim 18, further comprising at least one linear coupling oriented in parallel with the central axis and having first and second elongated components, the first component being coupled to the stiffener and the second component being coupled to the transition insert, the first and second components being movably coupled to each other.

20. The manipulator of claim 19, further comprising a linear adjustment mechanism, having a first portion coupled to the stiffener and a second portion coupled to the transition insert along the at least one linear coupling.

21. The manipulator of claim 20, wherein the interface coupling includes a spherical bearing having an outer race coupled to the first portion of the interface coupling and an inner race coupled to the second portion of the interface coupling.

22. The manipulator of claim 21, wherein the elongated blade has a hole within which the spherical bearing is disposed, and the transition insert has left and right plates, each having holes, disposed on opposing sides of the elongated blade, the transition insert including: a shaft passing through the holes in the left and right plates, and though the hole in the elongated blade and engaging the inner race of the spherical bearing.

23. The manipulator of claim 22, further comprising:
left and right retaining plates disposed on opposing sides of the hole in the elongated blade, each having a hole through which the shaft passes, and being fixedly attached to the elongated blade and to the outer race of the spherical bearing.

* * * * *